United States Patent
Huang et al.

(10) Patent No.: US 7,829,390 B2
(45) Date of Patent: Nov. 9, 2010

(54) PACKAGING STRUCTURE OF SIP AND A MANUFACTURING METHOD THEREOF

(75) Inventors: Chung-Er Huang, Taipei (TW); Ming-Tai Kuo, Taipei (TW)

(73) Assignee: Azurewave Technologies, Inc., Taipei (TW)

( * ) Notice: Subject to any disclaimer, the term of this patent is extended or adjusted under 35 U.S.C. 154(b) by 77 days.

(21) Appl. No.: 12/292,497

(22) Filed: Nov. 20, 2008

(65) Prior Publication Data

US 2010/0123238 A1    May 20, 2010

(51) Int. Cl.
   *H01L 21/56* (2006.01)
(52) U.S. Cl. .............................. 438/127; 257/E21.502; 257/E23.119; 257/E23.123; 257/E23.134; 257/788
(58) Field of Classification Search .................. 438/113, 438/127; 257/788, 789, E23.116, E23.117, 257/E23.119, E23.123, E23.134, E21.502
   See application file for complete search history.

(56) References Cited

U.S. PATENT DOCUMENTS

| | | | | |
|---|---|---|---|---|
| 4,935,164 A | * | 6/1990 | Wessling et al. ............ | 252/500 |
| 5,279,769 A | * | 1/1994 | Kokkonen et al. .......... | 252/500 |
| 6,601,293 B1 | * | 8/2003 | Glenn ......................... | 29/841 |
| 7,198,987 B1 | * | 4/2007 | Warren et al. ................ | 438/112 |
| 7,700,411 B2 | * | 4/2010 | Yang et al. ................... | 438/109 |
| 2004/0231872 A1 | * | 11/2004 | Arnold et al. ............. | 174/35 R |
| 2006/0055500 A1 | * | 3/2006 | Burke et al. ............... | 338/22 R |
| 2006/0164189 A1 | * | 7/2006 | Tohya et al. ................. | 333/238 |
| 2006/0220222 A1 | * | 10/2006 | Zeng ........................... | 257/700 |
| 2008/0053692 A1 | * | 3/2008 | Tohya et al. ................. | 174/260 |
| 2009/0315156 A1 | * | 12/2009 | Harper ........................ | 257/660 |

\* cited by examiner

*Primary Examiner*—Mary Wilczewski
(74) *Attorney, Agent, or Firm*—Rosenberg, Klein & Lee

(57) ABSTRACT

A manufacturing method for a packaging structure of SIP (system in package) includes the following steps. First step is providing a substrate having electronic devices thereon. Second step is covering the electronic devices by a mixture of a molding compound and a conductive polymer precursor so as to form a molding structure, wherein the substrate, the electronic devices and the molding structure forms a collective electronic module. Third step is separating the collective electronic module into a plurality of individual electronic modules. Fourth step is performing a doping step by using a doping element for transforming the conductive polymer precursor in the mixture into a conductive layer near the surface of the molding structure. Therefore, the manufacturing method is optimized for forming a shielding structure of the SIP module.

8 Claims, 4 Drawing Sheets

PACKAGING STRUCTURE OF SIP AND A MANUFACTURING METHOD THEREOF

BACKGROUND OF THE INVENTION

1. Field of the Invention

The present invention relates to a packaging structure of SIP (system in package) and a manufacturing method thereof, and in particular to a packaging structure of sip using conductive polymer and a manufacturing method thereof.

2. Description of Related Art

With the development of semiconductor technology, more and more functional electronic devices related to semiconductor are manufactured. Consequently related electronic devices have more and more connection pins (terminals) for transmitting the huge amounts of data. Thus, packaging technique electronic devices related to semiconductor is an area of focused for improvement, and studies and researches are done for improving the packaging capability. For example, wireless products have properties of small size and light weight, high performance, low price, low power consuming, and high reliability so that they are widely used by many applications and have a high marketing value. In wireless system, the shielding structure of the packaging structure plays an important role for preventing the wireless devices from electromagnetic interference, which is crucial for achieving high transmission quality.

Therein, the shielding structure can be formed in different ways due to different desired applications. For example, one conventional method is putting a metal casing on the electronic device. As we know, electronic devices or modules usually have different sizes and shapes so that it is necessary to prepare metal casings with different sizes and shapes to assembly on the different devices. Therefore, the manufacturer spends much manufacturing cost and time for forming the shielding structure.

Furthermore, the aforementioned metal casing is disposed on the electronic device by a complex procedure including forming, sharpening, assembling, and fixing (i.e. stabilizing). Thus, it is believed that the traditional method is not suitable for efficient production line.

Therefore, in view of this, the inventor proposes the present invention to overcome the above problems based on his expert experience and deliberate research.

SUMMARY OF THE INVENTION

The primary object of the present invention provides a manufacturing method for a packaging structure of SIP (system in package). The method is applied for forming a conductive layer within a molding structure, wherein the conductive layer performs as a shielding structure. Furthermore, the insulating property of the inner portion of the molding structure is maintained for packaging the electronic devices. Therefore, the manufacturing cost is reduced due to the high integrity of the method.

In order to achieve the above object, the present invention provides a manufacturing method for a packaging structure of SIP (system in package). The method includes the following steps. Step 1 is providing a substrate which has at least one electronic device thereon. Step 2 is covering the electronic device by a mixture of a molding compound and a conductive polymer precursor so as to form a molding structure, wherein the substrate, the electronic device, and the molding structure forms a collective electronic module. Step 3 is separating the collective electronic module into a plurality of individual electronic modules; and step 4 is performing a doping step by using a doping element for transforming the conductive polymer precursor inside the molding structure into a conductive layer on the surface of the molding structure.

The present invention further provides a packaging structure of SIP (system in package). The structure has a substrate having at least one electronic device thereon and a molding structure covering the electronic device. The molding structure is made of a mixture of a molding compound and a conductive polymer precursor, and the conductive polymer precursor is formed a conductive layer on the surface of the molding structure, whereby the forming of the conductive layer is via doping of the conductive polymer precursor The present invention demonstrates a chemical doping treatment for activating the conductive polymer precursor so that the conductive polymer precursor is transformed into a conductive material. The activated conductive material performs as a shielding structure for electromagnetic protection. In another embodiment, the activated conductive material performs as a grounding structure.

In order to better understand the characteristics and technical contents of the present invention, a detailed description thereof will be made with reference to the accompanying drawings. However, it should be understood that the drawings and the description are illustrative only and are not for limiting the scope of the present invention.

DETAILED DESCRIPTION OF PREFERRED EMBODIMENTS

Plastic material is a polymer and is a kind of insulating material. However, in the case that electrons in plastic can move as free as the electrons of metal, the plastic can have conductive property. In order for plastic to have conductive property, the plastic must be polymer with conjugated double bond structure, such as polyacetylene. For example, polyacetylene and a treatment for removing electron or adding electron-hole in the polymer (i.e. doping step) may transform the insulating polymer into a conductive polymer because of the free electrons. The transformed plastic material is called conductive plastic, and the pre-doping material is called the conductive polymer precursor. Polyacetylene, polyaniline, poly-p-phenylenevinylene (PPV) and their derivatives are taken as examples of conductive polymers. Briefly speaking, chemist Alan G. MacDiarmid and physicist Alan J. Heeger used vapor of Iodine for treating polyacetylene and they found that the doped polyacetylene has good conductivity. The transformation from insulating polymer to conductive polymer is observed in 1976. Thus, the transformation of conductivity is applied in the present invention so that the complex method for manufacturing shielding structure on the SIP module is simplified.

Figure 2:
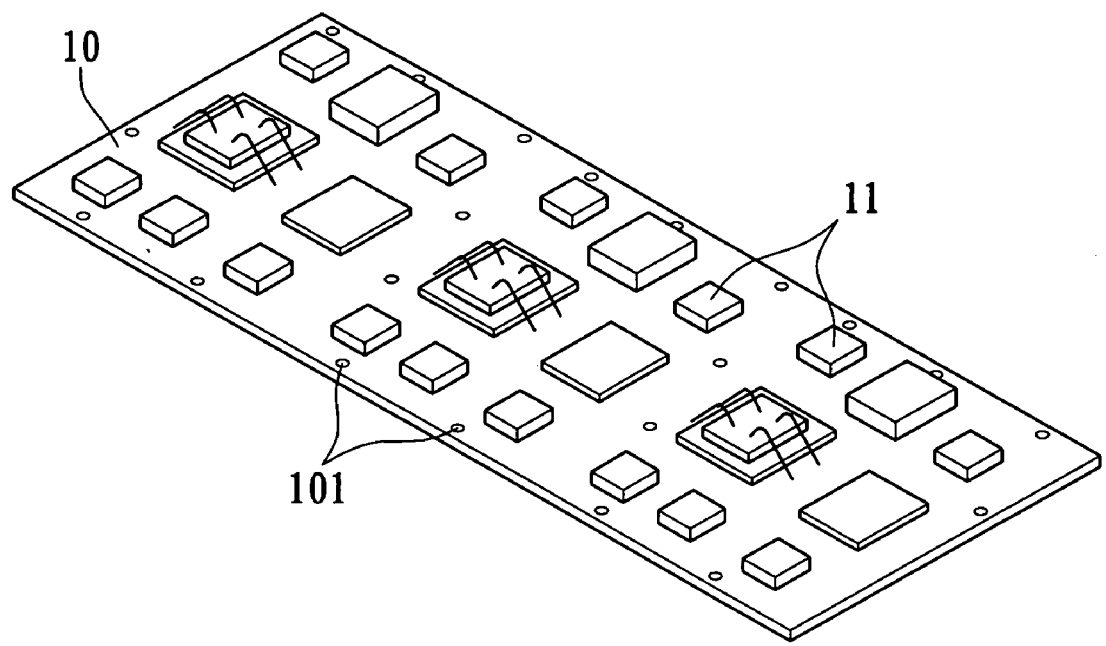
FIG. 2 is a schematic diagram showing electronic devices mounted on a substrate according to the present invention.
Figure 2A:
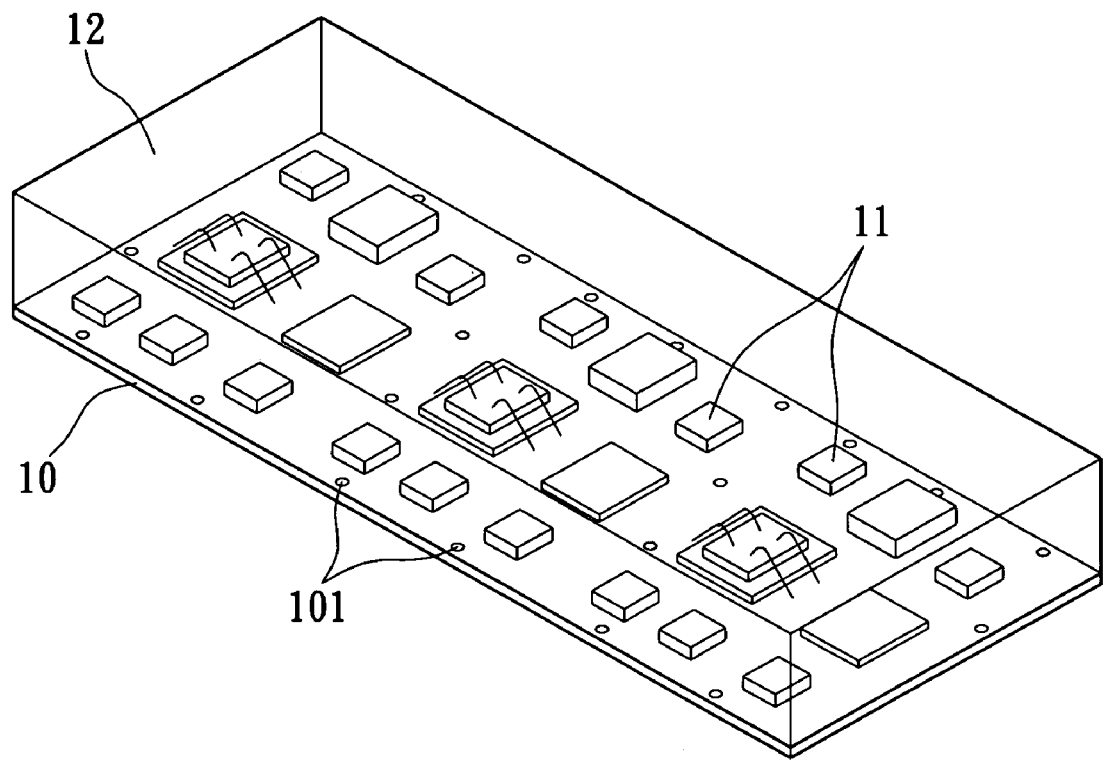
FIG. 2A is a schematic diagram showing that a molding structure is formed to cover the electronic devices according to the present invention.
Figure 3:
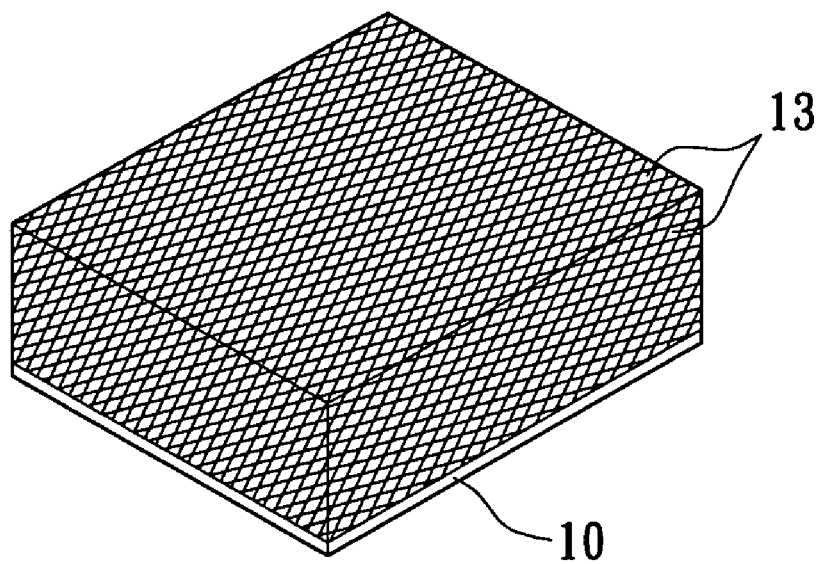
FIG. 3 is a schematic diagram showing that an auxiliary conductive layer is formed on the top and side surfaces of the molding structure according to the present invention.
Figure 3A:
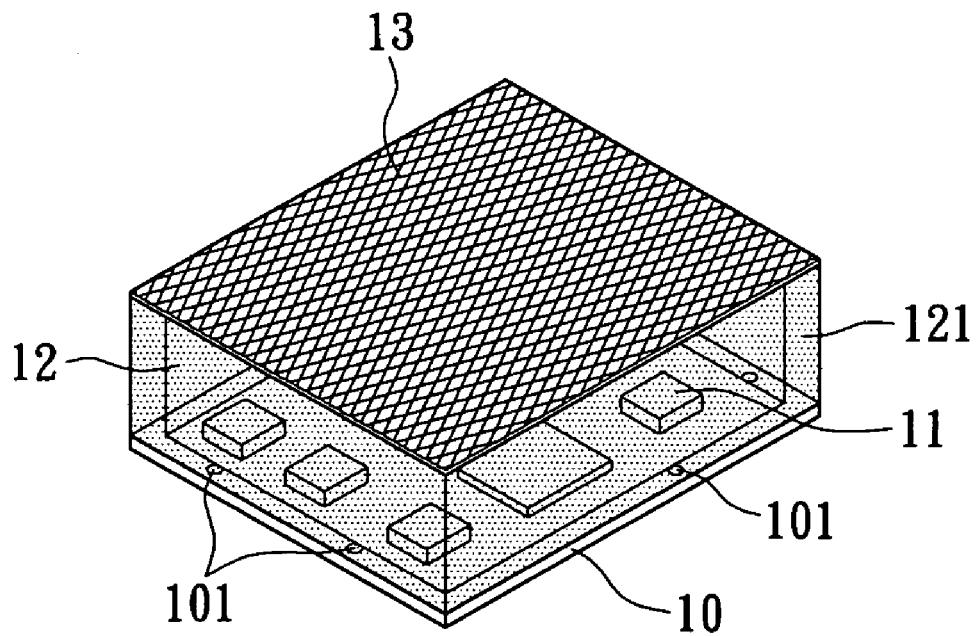
FIG. 3A is a schematic diagram showing that the auxiliary conductive layer is formed on the top surface of the molding structure according to the present invention.
Figure 4:
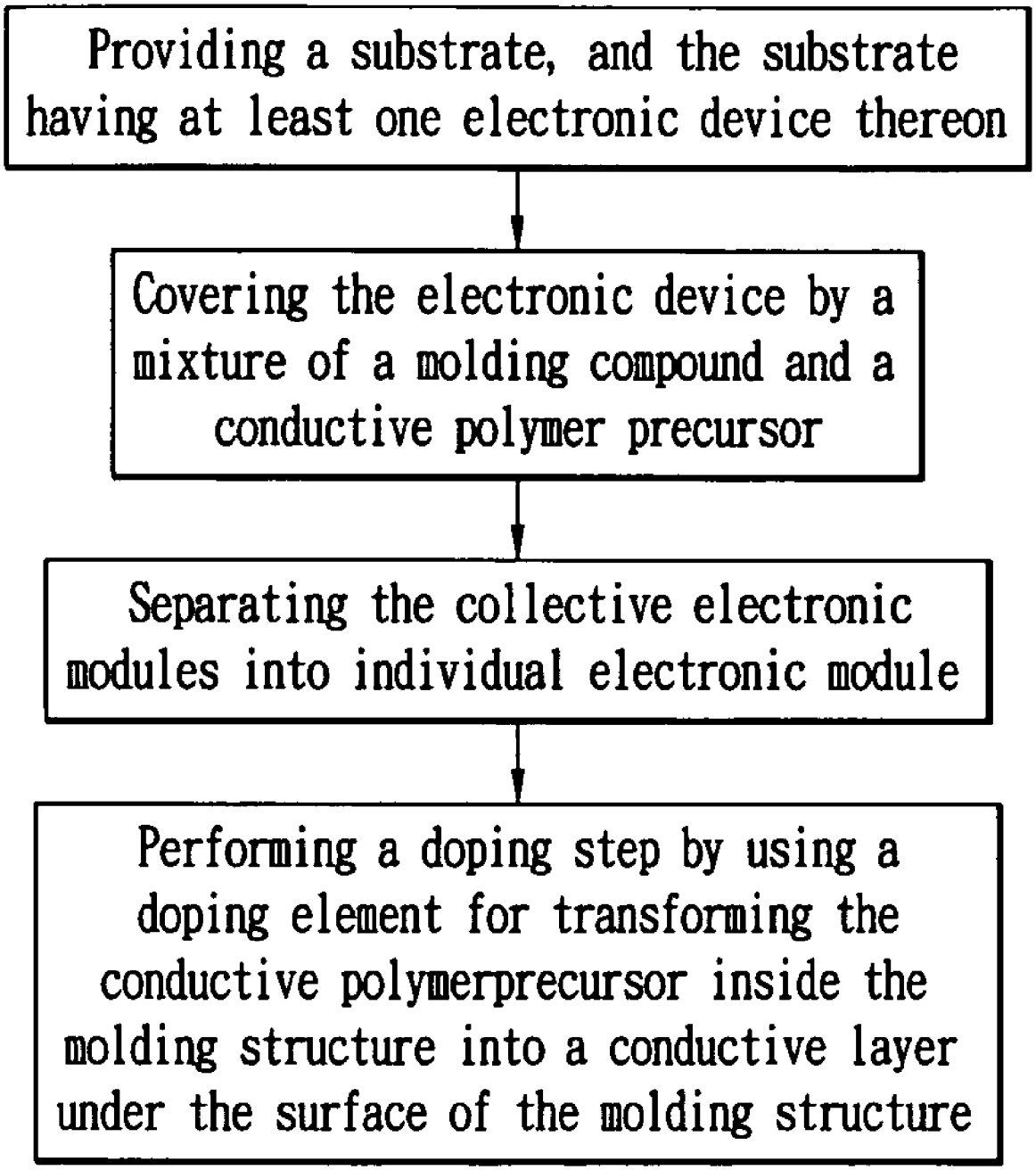
FIG. 4 is a flowchart showing the steps of manufacturing method according to the present invention.

Please refer to FIG. 4, a manufacturing method for a packaging structure of SIP (system in package) is disclosed. The method is used for directly forming a shielding structure and a grounding structure for the packaging structure of SIP so that the cost of production is reduced. The method includes the following steps (please refer in conjunction to FIG. 1 to FIG. 3A):

Step one is providing a substrate 10, and the substrate 10 has at least one electronic device 11 thereon as shown in FIG. 2. In FIG. 2, the electronic devices 11 are constructed as three electronic modules and each module is a kind of packaging structure of SIP, such as Bluetooth module, wireless module and etc.

Next, a filling mixture is provided by mixing a molding compound and a conductive polymer precursor. The mixture is used for covering the electronic devices 11 and then when cured forms a molding structure 12. The substrate 10, the electronic devices 11, and the molding structure 12 are combined as collective electronic modules (i.e. the modules are not separated). The filling mixture used in the present invention is different from the traditional molding materials. The predetermined percentage of the conductive polymer precursor is added into the molding compounds. The percentage of the conductive polymer precursor is determined by considering the forming property and the final conductive property. However, the conductive polymer precursor can be used by itself for forming the molding structure 12 without the molding compound. Alternatively, the conductive polymer precursor can be mixed with more than one kind of molding compounds for forming the molding structure 12. In the embodiment, the conductive polymer precursor is mixed with one molding compound and the mixture is formed as the molding structure 12 by the stamping mold method.

Step 3 is a cutting step for separating the collective electronic module into a plurality of individual electronic modules. Therefore, a single electronic module with molding structure 12 is formed and then the single electronic module is treated by a doping step.

Step 4 is a doping step. Specifically the doping step is the modifying of the molding structure 12 by a chemical doping method. Because of the conductive polymer precursor added inside the molding structure 12, a conductive layer 121 is formed and extended from the surface of the molding structure 12 inwardly after the conductive polymer precursor is transformed into conductive polymer by the chemical doping method. Therefore, a depth extending down from the surface of the insulating molding structure 12 can be transformed into conductive layer 121, and the conductive layer 121 performs as a shielding structure or a grounding structure. In the embodiment, material of polyacetylene (PA) is added inside the molding compound and the element of Iodine, arsenic fluoride, or Bromine may be referred to as a doping element, and is used for doping into the molding structure 12 and for transforming the precursor near the surface of the molding structure 12 into conductive polymer. Thereby the conductive layer 121 is formed. In detail, the conductivity of the molding structure 12 is approximately 1000 S/cm and the conductive layer 121 is formed near the surface of the molding structure 12. The concentration of the doping element, the doping temperature, the doping pressure, and the doping humidity are variable settings for controlling the depth of the conductive layer 121 in this doping step for forming a conductive casing for shielding the electronic devices 11. It is noted that the inner portion of the molding structure 12 will not be treated by the doping procedure so that the inner portion of the molding structure 12 is still insulative. Thus, the functions of the electronic devices 11 will not be influenced by the chemical doping method. In another embodiment, polyaniline performs as the precursor and is mixed into the molding compound. Then, a modifier (doping element), for example an acid is used for the doping step in order to transform the polyaniline into a conductive material for forming the conductive layer 121. The plurality of individual electronic modules after undergoing the doping step forms the packaging structure of SIP.

Figure 1:
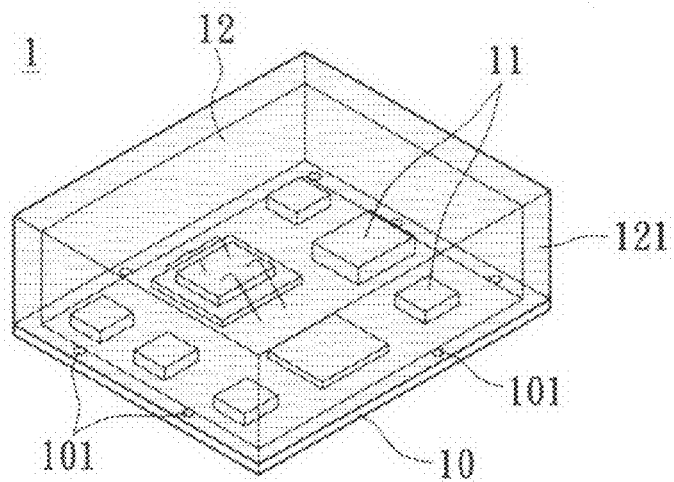
FIG. 1 is a schematic diagram showing a packaging structure of SIP according to the present invention.
Figure 1A:
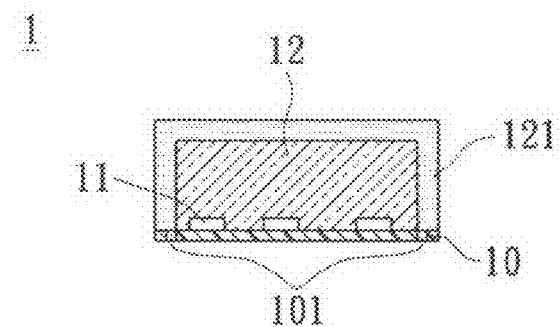
FIG. 1A is a side view of the schematic diagram showing the packaging structure of SIP according to the present invention.
Figure 1B:
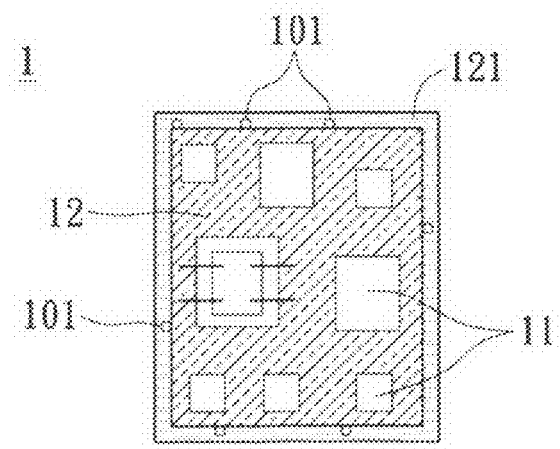
FIG. 1B is a top view of the schematic diagram showing the packaging structure of SIP according to the present invention.

Please refer to FIGS. 1A and 1B; a single electronic module is shown. The substrate 10 has at least one grounding via 101. The conductive layer 121 has a predetermined width (i.e. the depth extending inwardly from the surface of the molding structure 12) so that the conductive layer 121 can contact electrically with the grounding via 101. Thus, the conductive layer 121 has the grounding potential. It is noted that the grounding via 101 is formed at a short distance from the edge of the substrate 10 due to the manufacturing process and the parameters as controlled by the doping step in step 4 for substantially connecting the conductive layer 121 electrically with the grounding via 101. However, the short distance between the grounding via 101 and the edges of the substrate 10 in this embodiment may be formed by the manufacturing method of the substrate 10 and thus is not meant as a restriction to the present invention.

For increasing the conductive property of the conductive layer 121, an auxiliary conductive layer 13 is added in another embodiment. The auxiliary conductive layer 13 is formed by the following methods. One method is forming an auxiliary conductive layer 13 on the top of the molding structure 12 before the aforementioned step 3, for example, an attaching method, a coating method, a sputtering method, an electrical plating method, or a chemical plating method can be used for forming the auxiliary conductive layer 13 on the top of the molding structure 12. Then, step 3 (cutting step) and step 4 (doping treatment) are processed. At last, the conductive layer 121 and the auxiliary conductive layer 13 are formed on the molding structure 12. Please note that the auxiliary conductive layer 13 is simply disposed on the top of the molding structure 12 as shown in FIG. 3A.

Another method is forming an auxiliary conductive layer 13 on the top and sides of the molding structure 12 after the aforementioned step 4. In other words, the auxiliary conductive layer 13 is formed after the doping step. Similarly, the attaching method, the coating method, the sputtering method, the electrical plating method, or the chemical plating method can be used for forming the auxiliary conductive layer 13 on the top and side surfaces of the molding structure 12 of the single electronic module. Please note that the auxiliary conductive layer 13 is formed on the surface of the molding structure 12 and does not cover the side edge of the substrate 10 (as shown in FIG. 3).

Accordingly, the conductive polymer precursor is used for forming the conductive layer 121 as a shielding structure or a grounding structure in the present invention. In accordance with the above description, the packaging structure of SIP has a substrate 10, at least one electronic device 11 on the substrate 10, and a molding structure 12 covering the electronic device 11. The material of the molding structure 12 is a mixture with a conductive polymer precursor and a molding compound. After the doping step, the conductive polymer precursor near the surface will be transformed into conductive material in order to form the conductive layer 121 within the molding structure 12. Thus, a single structure (i.e. molding structure 12) can provide two functions, one is shielding effect provided by the conductive layer 121 and the other is packaging function. On the other hand, a simple and controllable doping step can be easily applied for growing the conductive layer 121 so that the shielding or grounding function is achieved.

In the embodiment, the substrate 10 has at least one grounding via 101 on the periphery thereof. The conductive layer 121 extends inwardly from the surface of the molding structure 12 in order to contact electrically with the grounding via 101 so that the conductive layer 121 can have grounding potential. In another embodiment, an auxiliary conductive layer 13 is formed on the top surface of the molding structure 12 (shown in FIG. 3A) or on the top and side surfaces of the molding structure 12 (shown in FIG. 3) for improving the electrical properties.

Therefore, the present invention provides some advantages as following.

1. The manufacturing procedures of the shielding and packaging are integrated. A conductive layer 121 is formed by a doping step inside the molding structure 12, and the molding structure 12 has a packaging portion (inner portion of the molding structure 12) and a shielding portion (conductive layer 121 at the edge portion of the molding structure 12). The conductive layer 121 performs as a shielding casing and the inner portion of the molding structure 12 is still an insulating portion for protecting the electronic devices 11. Thus, the manufacturing cost is reduced because of the integrated method.

2. The depth of the conductive layer 121 is controlled by the parameters of the doping step so that the conductive layer 121 can operate in accordance with the circuit design in order to have multi-functions. For example, the conductive layer 121 can contact electrically to the grounding via 101 so that the conductive layer 121 performs grounding function.

Even though the present invention has been described with reference to the foregoing preferred embodiment, it shall be understood that the present invention is not limited to the details thereof. Various equivalent variations and modifications may occur to those skilled in this art in view of the teachings of the present invention. Thus, all such variations and equivalent modifications are also embraced within the scope of the present invention as defined in the appended claims.

What is claimed is:

1. A manufacturing method for a packaging structure of SIP (system in package), comprising:
    step 1 providing a substrate, having at least one electronic device thereon;
    step 2 covering the electronic device by a mixture of a molding compound and a conductive polymer precursor so as to form a molding structure, wherein the substrate, the electronic device, and the molding structure forms a collective electronic module;
    step 3. separating the collective electronic module into a plurality of individual electronic modules; and
    step 4. performing a doping step for transforming the conductive polymer precursor inside the molding structure into a conductive layer under the surface of the molding structure.

2. The manufacturing method for a packaging structure of SIP according to claim 1, wherein each of the plurality individual electronic modules has at least one grounding hole on an edge of the substrate, and the grounding via connects electrically with the conductive layer in step 4.

3. The manufacturing method for a packaging structure of SIP according to claim 1, wherein the mixture is formed into the molding structure by a stamping mold method.

4. The manufacturing method for a packaging structure of SIP according to claim 1, wherein the concentration of doping elements, a doping temperature, a doping pressure, and a doping humidity of the doping step are variable settings for controlling the depth of the conductive layer.

5. The manufacturing method for a packaging structure of SIP according to claim 1, further comprising a step for forming an auxiliary conductive layer on the top of the molding structure before step 3.

6. The manufacturing method for a packaging structure of SIP according to claim 5, wherein the auxiliary conductive layer is formed by an attaching method, a coating method, a sputtering method, an electrical plating method, or a chemical plating method.

7. The manufacturing method for a packaging structure of SIP according to claim 1, further comprising a step for forming an auxiliary conductive layer on the top and side surfaces of the molding structure after step 4.

8. The manufacturing method for a packaging structure of SIP according to claim 7, wherein the auxiliary conductive layer is formed by an attaching method, a coating method, a sputtering method, an electrical plating method, or a chemical plating method.

* * * * *